United States Patent [19]

Heck

[11] Patent Number: 4,755,774
[45] Date of Patent: Jul. 5, 1988

[54] TWO-PORT SYNTHESIZER MODULATION SYSTEM EMPLOYING AN IMPROVED REFERENCE PHASE MODULATOR

[75] Inventor: Joseph P. Heck, Ft. Worth, Tex.

[73] Assignee: Motorola Inc., Schaumburg, Ill.

[21] Appl. No.: 913,625

[22] Filed: Sep. 30, 1986

Related U.S. Application Data

[63] Continuation-in-part of Ser. No. 755,257, Jul. 15, 1985, abandoned.

[51] Int. Cl.$^4$ ............................................. H03C 3/09
[52] U.S. Cl. ....................................... 332/18; 332/19; 455/113
[58] Field of Search ............... 332/18, 19, 23 R, 30 V, 332/16 T, 16 R; 455/42, 110, 112, 113

[56] References Cited

U.S. PATENT DOCUMENTS

| | | |
|---|---|---|
| 3,323,062 | 5/1967 | Ganzel et al. |
| 3,328,727 | 6/1967 | Lynk, Jr. ................................ 332/30 |
| 3,693,113 | 9/1972 | Glasser et al. ....................... 332/9 R |
| 4,052,672 | 10/1977 | Enderby et al. ............... 332/16 R X |
| 4,153,884 | 5/1979 | Ikeguchi et al. .................... 331/25 X |

FOREIGN PATENT DOCUMENTS

| | | | |
|---|---|---|---|
| WO81/03250 | 11/1981 | World Int. Prop. O. ........... | 455/112 |
| 1161205 | 8/1969 | United Kingdom . | |

OTHER PUBLICATIONS

Brennand et al., "Frequency Synthesizer Using LSI Devices", Electric Components and Applications, vol. 3, No. 1, Nov. 1980, pp. 47-61 (332-19).

Primary Examiner—Siegfried H. Grimm
Attorney, Agent, or Firm—Donald B. Southard; Chuck L. Warren

[57] ABSTRACT

An improved frequency modulator apparatus for use in phase-locked loop (PLL) frequency synthesizers is disclosed which makes possible high deviation, low distortion, FM signals for a wide range of modulating signals, such as digital data or low frequency tone modulation. In a first embodiment having the improved frequency modulator, this apparatus advantageously injects the modulation signal into two ports, one at the VCO and the other provided in an unmodulated reference source signal chain. By properly balancing the levels into each of these two ports, a cancellation effect occurs which nulls the modulation signal at the output of the phase detector. In a second embodiment, the improved frequency modulator is incorporated in a PLL frequency synthesizer with an offset mixer to achieve relatively wide percentage deviation at a low frequency RF carrier. In a third embodiment, the improved frequency modulator is incorporated in a PLL synthesizer in its feedback loop so as to cancel the modulation components before they reach the phase detector. Thus, in the first two embodiments, the added phase modulator is inserted in the reference source signal path to the phase detector, while in the alternate third embodiment, the phase modulator is inserted into the feedback path and includes a phase inverter stage to correct for the inherent modulation polarity reversal.

25 Claims, 7 Drawing Sheets

—PRIOR ART—

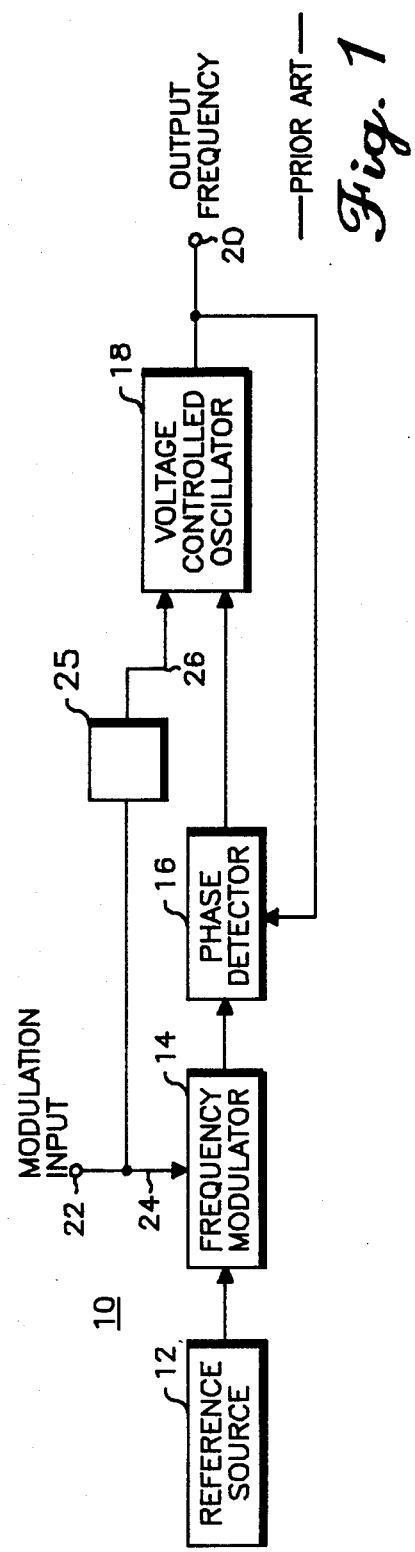
Fig. 1 — PRIOR ART —
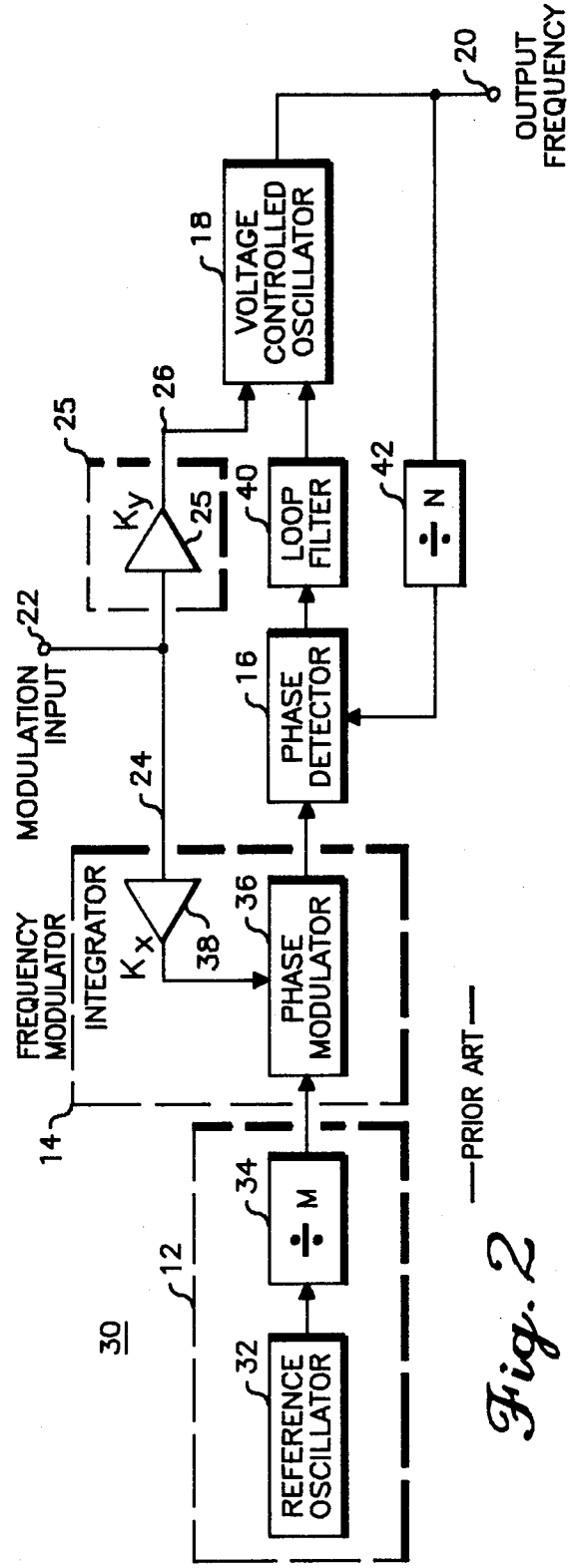
Fig. 2 — PRIOR ART —

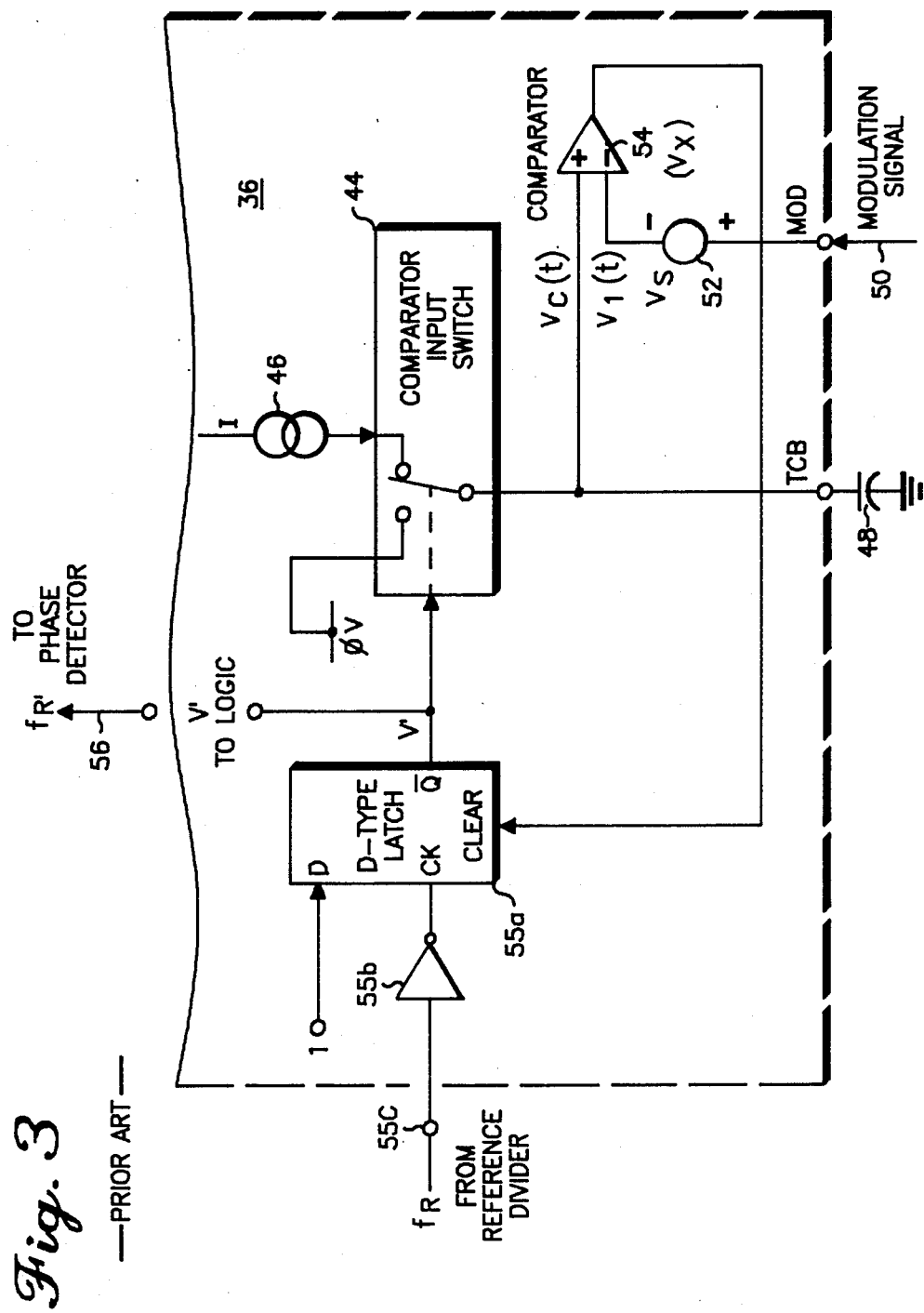
Fig. 3 —PRIOR ART—

TWO-PORT SYNTHESIZER MODULATION SYSTEM EMPLOYING AN IMPROVED REFERENCE PHASE MODULATOR

This application is a continuation-in-part of application Ser. No. 755,257, filed July 15, 1985 and now abandoned.

BACKGROUND OF THE INVENTION

The present invention relates generally to modulated frequency synthesizers, and more particularly to an improved method and arrangement for modulating phase-locked loop frequency synthesizers. This arrangement can accommodate voice signals as well as digital data or low frequency tone modulation and can produce high deviation, FM (frequency modulated) signals with very low distortion, while exhibiting a flat, wide, modulation bandwidth that is independent of the phase-locked loop bandwidth.

Today's communications systems require efficient use of the crowded radio spectrum, especially in congested metropolitan areas. To achieve efficient use of this limited congested spectrum, modern communications systems use elaborate data and tone-coded signalling schemes, such as Private Line (PL) and Digital Private Line (DPL) available in radios from Motorola, Inc., which force greater performance from the overall transmitter design. That is, they are expected to be able to utilize the available modulation bandwidth down to nearly DC, (or at least to under 1 Hz), as well as beyond voice frequencies. In addition, such transmitters are expected to maintain their carrier frequency with high stability and yet offer fast lock time and wide deviation capability with very low distortion, all of which have an impact on the manner in which the transmitter can be modulated. The above problems are exacerbated when attempting to design a transmitter for a relatively low radio frequency (RF) carrier, since there are few schemes for achieving relatively large percentage deviations of the RF carrier, and there are even fewer schemes which achieve the needed deviation with low distortion.

In any event, certain general techniques have been developed which address two of the three constraints by providing the desired carrier frequency stability and generally utilize a high stability unmodulated reference oscillator in conjunction with a phase-locked loop frequency synthesizer. Because these phase-locked loop arrangements generally include a frequency divider in the loop feedback path, they provide a way in which to effect wide output deviation.

One known improvement utilizing dual port modulation of a frequency synthesizer loop simultaneously applies modulation to both the input of a voltage controlled oscillator (VCO) and through a summing network to the output of a phase detector such that a cancellation of the two signals occurs without disrupting the error voltage normally outputted from the phase detector. This achieves wide deviation capability for a modulating signal while maintaining a high degree of frequency stability. Although such an arrangement achieves cancellation of the modulation components in the error voltage sent to the VCO and is suitable for some system designs, it nevertheless suffers from two serious drawbacks.

The first disadvantage is that any gain variations with temperature (especially for the phase detector) will adversely affect the modulation sensitivity. Moreover, if high modulation sensitivities are used, any variation in gain can be significant. This is because it is difficult to balance the two modulation ports when wide bandwidths are needed. What is meant by "balance" is that the designer insures that each modulation port individually provides the same magnitude of deviation sensitivity, or peak frequency deviation per volts of modulation signal, and further, that each modulation port individually causes the same direction of deviation (positive or negative) in order to effect cancellation in the phase detector.

A second disadvantage of such an arrangement involves the time relationship of the two modulation components so induced. That is, the inputted reference modulation must be delayed in a suitable delay network so that it is maintained in phase synchronism with the VCO modulation components, in order to insure that complete cancellation occurs at the output of the summing network. A possible embodiment for this delay network is a sample and hold network. Without such a delay network, the frequency synthesizer will suffer degradation to data modulation, especially when relatively fast data rates are utilized. There will also be additional spurious output sidebands generated when attempting to utilize fast data rates without the benefit of such a suitable delay network. This correspondingly greater spurious output requires additional attenuation in the loop filter to prevent degrading the synthesizer's spurious output performance still further. But this forces the response time of the loop to be even slower.

A second known arrangement utilizes a slightly different scheme of dual port modulation for a frequency synthesizer by feeding the modulating signal in at the VCO and ahead of the phase detector, but is deficient in that it does not utilize the full modulation bandwidth that theoretically is available. Such a capability, especially at low modulating frequencies, is needed to make better use of the limited resources of frequency bands and modulation bandwidths dictated by ever-narrower channel bandwidths available for land mobile applications. This second known arrangement is only able to work effectively down to 500 Hz with 1.5% distortion, and down to 300 Hz with 5% distortion. Thus, utilizing such an arrangement wastes nearly 500 Hz of precious modulation bandwidth due to the unacceptably high distortion that results. Each of the disadvantages listed above leads to serious compromises in frequency synthesizer system performance, all of which are undesirable and wasteful.

Accordingly, there exists a need for an improved frequency modulation arrangement for a phase-locked loop frequency synthesizer which is able to accommodate voice signals as well as digital data or low frequency tone modulation with very low distortion, such that it can produce high deviation, FM signals while exhibiting a flat, wide, modulation bandwidth, down to approximately 1 Hz (and thus nearly equal to the theoretical maximum bandwidth). There exists a further need to provide the above mentioned capability in a transmitter having a low frequency RF carrier.

SUMMARY OF THE INVENTION

It is an object of the present invention to provide an improved, frequency modulation arrangement for a phase-locked loop frequency synthesizer having high stability such that it has a wide deviation capability which is nearly equal to the theoretical maximum modulation bandwidth.

It is a further object of the present invention to provide an improved frequency modulation arrangement for a phase-locked loop frequency synthesizer of the foregoing type such that it has wide deviation capability and very low distortion so that the modulation bandwidth is nearly equal to the theoretical maximum bandwidth.

It is a further object of the present invention to provide an improved frequency modulation arrangement of the foregoing type which is essential for use in a transmitter having a low frequency RF carrier, and requiring a relatively large percentage deviation capability.

It is a further object of the present invention to provide an improved serrasoid phase modulator which, when utilized with an integrator, permits low frequency modulating signals of less than 1 Hz to effect low distortion FM, so as to nearly equal the low frequency, low distortion performance characteristics of a direct-FM modulated VCO.

In practicing one form of the invention, a particular frequency modulator arrangement is added to modulate the signal coming from an included high stability unmodulated reference oscillator within a phase-locked loop frequency synthesizer. With this frequency modulator cooperating with the modulated VCO, wide deviation over the full modulation bandwidth is possible. The wide deviation capability arises from the multiplication effect of modulating the signal occurring at the divided-down frequency outputted by the selectable-integer loop divider. Thus, the modulation information is injected at two separate ports within the phase-locked loop frequency synthesizer. The first port is at the input of the VCO, while the second port feeds a frequency modulator consisting of a particular improved form of serrasoid phase modulator interposed between the output of the fixed divider and the reference signal input of the phase detector. A serrasoid phase modulator is one which creates a sawtooth output waveform in which the modulating signal affects the time occurrences of zero crossings on either the rising or falling edges of the inputted reference signal. In the present invention, it also includes a comparator on the output to permit a square waveform to be generated. Furthermore, by placing an integrator network ahead of the serrasoid phase modulator, frequency modulation is effected. As will be seen, the present invention accomplishes frequency modulation of the reference signal by modulating the critical, or rising, edge of the output of the reference divider before it is applied to the phase detector. Prior phase modulators were only able to accomplish 1.5% distortion at 500 Hz, degrading to 5% distortion at 300 Hz. By contrast, the phase modulator according to the present invention is able to handle a wide range of modulating signals, including tones as low as 1 Hz, through normal voice frequencies, to relatively high digital data frequencies, with relatively low distortion. The present invention has measured performance which exhibits less than 0.2% distortion at 30 Hz with 8 KHz of deviation (4 KHz peak deviation). This distortion measurement is usually conducted according to EIA standards which measure the desired signal in the presence of noise and distortion (SINAD). The modulation information inputted to the phase modulator is, of course, integrated in order to produce frequency modulation of the reference signal. The other port accomplishes direct FM of the VCO in a manner (or polarity) the same as that induced by the reference modulator so that the modulated output signal fed back through the loop divider nulls, or cancels, with the modulated reference signal within the phase detector of the phase-locked loop. Thus it should be evident that the goal is to make the phase modulator capable of nearly the same performance as that of the direct-FM VCO, especially with regard to noise and distortion at low frequencies.

An alternate form of phase-locked loop employing the present invention utilizes the frequency modulator in the feedback path between the loop divider and the phase detector (in conjunction with a phase inverter) to achieve cancellation of the modulation components before they reach the phase detector. Each of these two port modulation systems has a widened usable bandwidth resulting from the improved distortion characteristics of the serrasoid phase modulator, while still exhibiting an essentially flat modulation frequency response as well as the widened deviation capability given by the factor N of the loop divider. Moreover, the modulation bandwidths may be set independently of the loop bandwidth.

These and other objects of the present invention will become apparent to those skilled in the art upon consideration of the accompanying specification, claims, and drawings.

BRIEF DESCRIPTION OF THE DRAWINGS

Referring to the drawings, wherein like reference numerals indicate like elements in the several figures and in which:

FIG. 1 is a block diagram of a frequency modulator arrangement for a frequency synthesizer according to the known art.

FIG. 2 is a more detailed block diagram of a frequency modulator arrangement for a frequency synthesizer according to the known art having an included fixed divider in the reference frequency chain before the phase detector.

FIG. 3 is a functional representation of a typical serrasoid phase modulator according to the known art.

FIG. 6b illustrates signal diagrams showing the function of the improved frequency modulator as represented in FIG. 6a.

DETAILED DESCRIPTION

Figure 4:
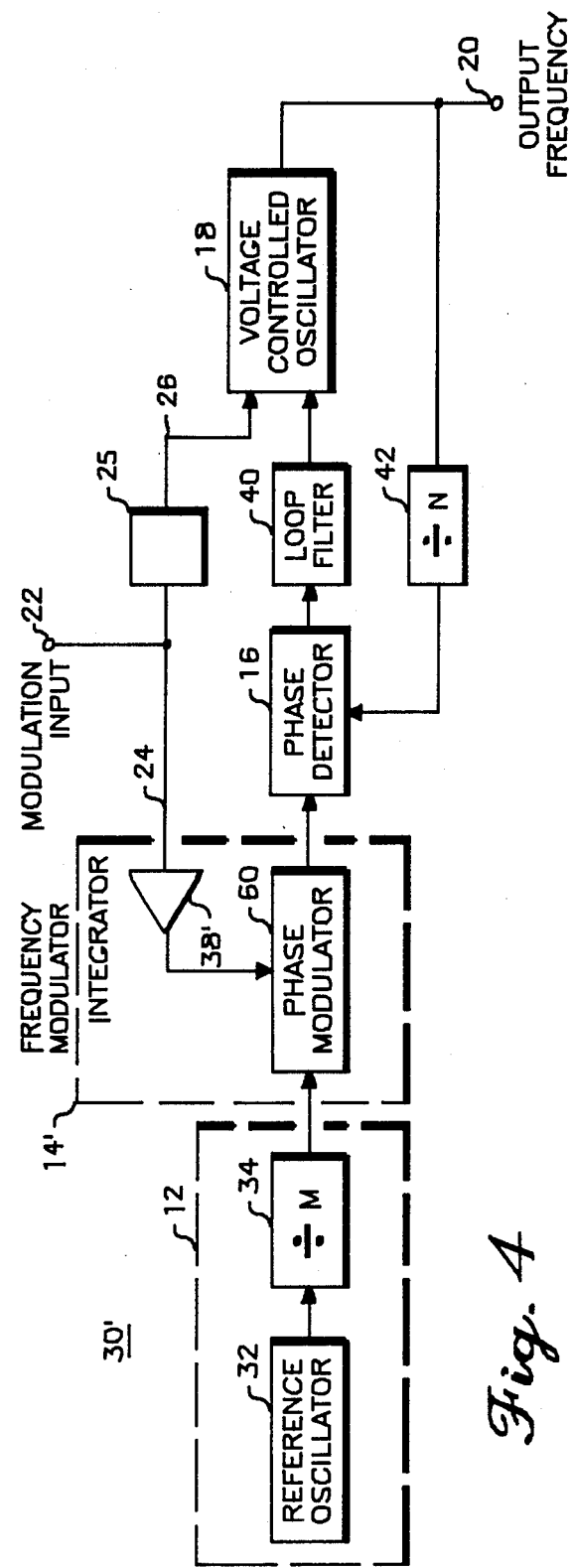
FIG. 4 is a block diagram of a frequency modulator arrangement for a frequency synthesizer according to the present invention.

Referring now to the drawings, a basic phase-locked loop (or PLL) frequency synthesizer arrangement 10 is shown in FIG. 1 which includes a two-port modulation capability, according to the known art. This PLL synthesizer arrangement exhibits a single output frequency and consists of a reference source 12, a frequency modulator 14, a phase detector 16, a voltage controlled oscillator (or VCO) 18 having an output 20, a portion of which is fed back to phase detector 16. The modulating signal enters at 22 and is fed to each of the two ports, 24 and 26, so as to modulate the frequency of output 20. Intervening stage 25 provides gain and frequency shape adjustment. Thus, by using this two-port modulation arrangement on a PLL frequency synthesizer, cancellation of the two modulating signals at the output of phase detector 16 results for a single output frequency.

A more useful embodiment of a modulated PLL frequency synthesizer arrangement is depicted at 30 that provides a number of different output frequencies such as are needed in multi-channel transmitter or transceiver, as shown in FIG. 2. Like numerals are employed for corresponding components wherever applicable. In this embodiment, the PLL consists of a reference source 12, a frequency modulator 14, a phase detector 16, and a VCO 18 having an output 20, as shown. Here, reference source 12 includes reference oscillator 32 and fixed-integer frequency divider 34. Frequency modulator 14 includes phase modulator 36 with integrator 38 at the frequency modulator input port 24. Between phase detector 16 and VCO 18, is loop filter 40, as shown. Connected in the output feedback path from VCO 18 back to phase detector 16 is selectable-integer frequency divider 42, as shown. This arrangement utilizes the multiplicative effect of variable-integer frequency divider 42 as well as cancellation of the modulating signals within phase detector 16 to achieve wide deviation with low distortion at output 20 for modulating frequencies between 300 Hertz (Hz) and 4 KHz, or voice frequencies. Arrangement 30 of FIG. 2 allows the modulation signal bandwidth to be set independently of the requirement for the loop bandwidth, which is controlled by means of loop filter 40. More particularly, phase use of loop divider 42 provides the capability of magnifying the effective deviation by the divider variable "N", since the loop attempts to maintain a constant error signal by cancellation of the modulating signals at the output of phase detector 16.

FIG. 3 depicts a basic diagram of a typical phase modulator 36, according to the known art, which is of the serrasoid type. A switch 44, acted upon by a combination of signals, including reference frequency $f_r$, creates a pulse stream at the periodic rate of $f_r$ having a voltage ramp on the critical, or rising, edge due to current source 46 and capacitor storage element 48. This pulse stream signal is compared with the value of the modulation signal 50 (plus a DC bias voltage 52) in connection with comparator 54. The output of comparator 54 clears D-type latch 55a which has inverter 55b connected to its clock input. The output of D-type latch 55a produces V' which represents the resultant modulated reference signal $f_r'$ at output 56. According to the known art, serrasoid modulator 36 modulates the trip voltage of comparator 54 such that the critical or rising edge of the output waveform at 56 shifts.

Figure 5:
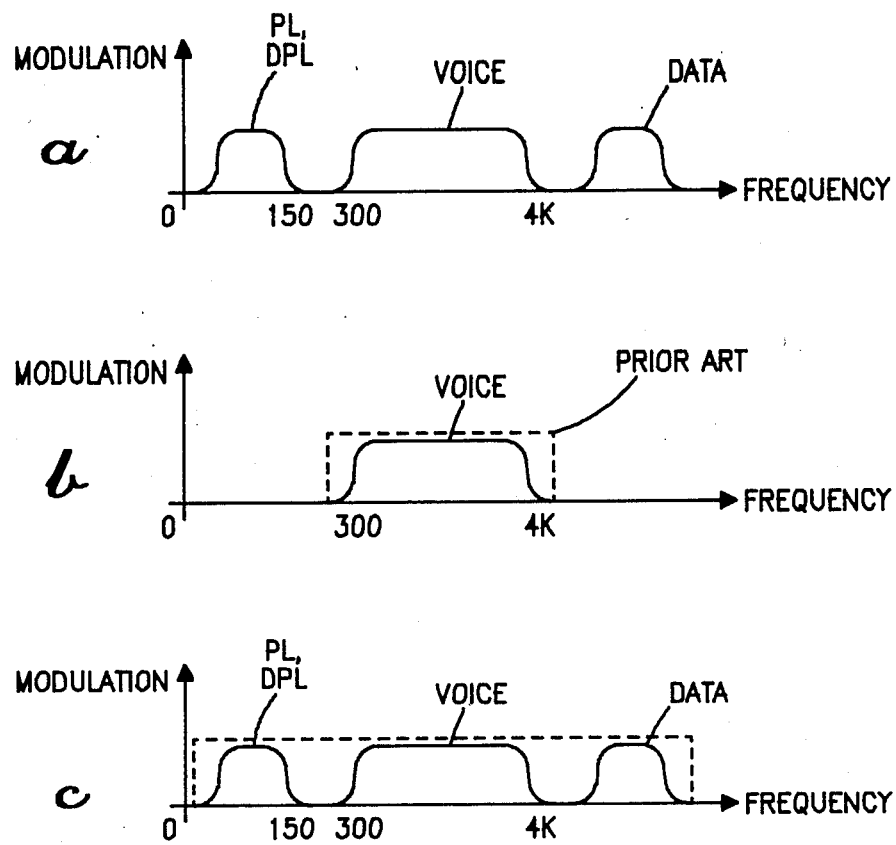
FIG. 5 is an illustration of the modulation spectral bandwidths resulting when attempting to transmit baseband information (a) according to the teachings of the prior art (b), in contrast to the teachings of the present invention (c).

A two-port modulation arrangement employing the present invention is shown at 30' in FIG. 4. As shown, it includes a reference source 12, a modified frequency modulator 14', a VCO 18 having an output 20, a modulation input 22 feeding two ports, 24 and 26, with port 26 including an additional signal adjustment stage 25 as shown. Here, the modified frequency modulator 14' includes a particular serrasoid phase modulator 60, with a modified integrator 38', as shown. The PLL also includes loop filter 40, and selectable-integer frequency divider 42. The benefits of using such an arrangement as depicted in FIG. 4 are shown in the simplified frequency domain diagrams depicted in FIG. 5. FIG. 5a shows the frequency spectrum of the input modulation which is necessary in today's modern systems employing low frequency tones, such as Private Line or Digital Private Line frequencies, and digital data, in addition to voice frequencies. FIG. 5b depicts the capability of the known modulated frequency synthesizer arrangement depicted in FIG. 2 according to the known art. FIG. 5c depicts the modulation input handling capability for the frequency modulated PLL synthesizer according to the present invention. It should be noted in FIG. 5c that the low frequency tones, represented by PL and DPL, and the digital data are able to be transmitted as well as the voice frequencies. The full frequency modulating bandwidth capability depicted in FIG. 5c approaches and nearly equals the theoretical maximum bandwidth for frequency modulated transmitters and is brought about by the improved frequency modulator 14' represented in FIG. 4.

Figure 6A:
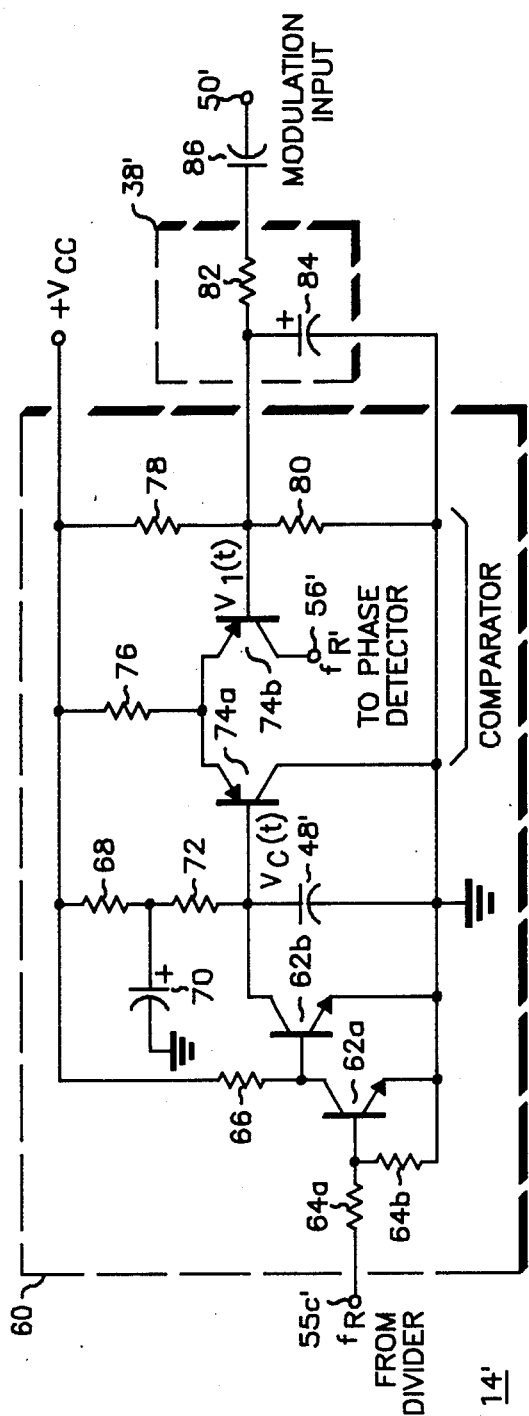
FIG. 6a is a schematic diagram of the improved frequency modulator according to the present invention.

The details of improved frequency modulator 14' are given in FIG. 6a, as shown. The integrator 38' and the improved serrasoid phase modulator 60 are shown within dashed lines. The phase modulator includes an input 55c' for the reference frequency $f_r$ from divider 34. It is applied to an electronic switch comprised of transistor 62a and 62b, having an input resistive divider 64a and 64b, and includes a supply resistor 66, as shown. Connected to electronic switch transistor 62b is capacitive storage element 48', which is fed from a passive current source having a filter section composed of resistor 68 and capacitor 70, which in turn feeds current-limiting resistor 72, as shown. Resistor 72 is chosen to be approximately one order magnitude larger than resistor 68. The node which joins resistor 72 with transistor 62b and capacitive storage element 48' make up one input to a comparator consisting of transistor 74a and 74b fed from a common emitter resistor 76 as shown. The output is taken from 56', which represents $f_R'$ fed to the phase detector. Resistive divider 78, 80, provides the bias voltage for transistor 74b as well as the second input point for the comparator to which the integrator 38' connects. Integrator 38' consists of resistor 82 and capacitor 84 connected as shown with a DC blocking capacitor 86. The modulation input is provided at terminal 50'. Upon further consideration of improved serrasoid phase modulator 60 it is evident that the components make up a voltage ramp generator utilizing the passive current source, the capacitive storage element 48', and the transistor switch 62a and 62b. If an active, or transistor, current source were used, a certain amount of shot noise would be included and would influence the voltage on capacitive element 48'. Assuming a DC current source having constant current value I with noise current $i_N$ and assuming a given ramp slope, as the voltage on capacitor 48' passes through the threshold voltage associated with comparator, the amount of time jitter is proportional to $i_N/I$. Since the transistor current source is dominated by shot noise, $$i_N^2 = 2qI,$$

$$i_N = (2qI)^{\frac{1}{2}},$$

and therefore $$i_N/I = (2q/I)^{\frac{1}{2}}. \tag{1}$$

For the circuit as depicted at 60 in FIG. 6a, the noise associated with the resistive passive current source is related to:

$$v_N^2 = 4KTR,$$

then $$i_N = v_N/R = 2(KT/R)^{\frac{1}{2}}.$$

Since the DC current I is given by:

$$I = (V_r - V_x)/R,$$

as the voltage on capacitive element 48' passes through the threshold voltage $V_x$, the value of noise associated with the passive current source is given by:

$$i_N/I = \frac{2(KTR)^{\frac{1}{2}}}{(V_r - V_x)},$$

which equals $$i_N/I = 2\sqrt{\frac{(KT)}{I(V_r - V_x)}}. \tag{2}$$

Then, for example, if:
I = 300 microamps,
$V_x$ = 3 volts, and
$V_c$ = 9 volts, then
R = 6 volts/300 microamps = 20K ohms,
and the shot noise associated with an active current source would result, according to equation (1), in a value of:

$$i_N/I = 3.27 \times 10^{-8} \text{ amperes}/\sqrt{\text{Hertz}},$$

whereas a passive current source associated with using a resistor results, according to equation (2), in a value of:

$$i_N/I = 3.03 \times 10^{-9} \text{ amperes}/\sqrt{\text{Hertz}}.$$

Thus, the passive current source should give more than 20 dB improvement over an active current source. In the above equations,
q = 1.6 × 10⁻¹⁹ coulomb, or electronic charge,
K = 1.38 × 10⁻²³ joule/degree Kelvin, (or Boltzman's constant), and
T = 300 degrees Kelvin, in absolute temperature.

In the preferred embodiment of the improved frequency modulator 60 of the present invention, typical values for the passive current source, including the filter section with a corner frequency of less than 1 Hz, include:
Resistor 68 = 2.2K ohms,
Capacitor 70 = 10 microfarads, and
Resistor 72 = 20K ohms.
The capacitive storage element 48' = 0.0015 microfarads. The values for integrator 38' include:
Resistor 82 = 0–200K ohms, for setting gain, and
Capacitor 84 = 22 microfarads.

Figure 6B:
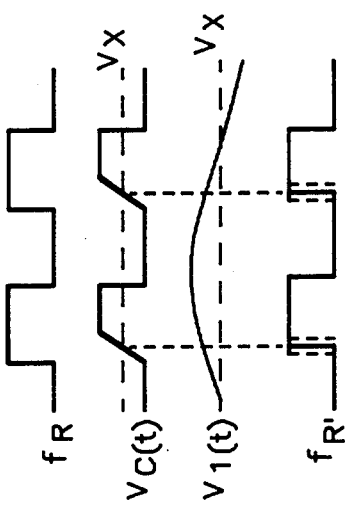

FIG. 6b depicts four waveforms representing the input signal $f_r$, the ramp voltage $V_c(t)$ on the capacitive element 48', $V_1(t)$ representing the variable trip voltage of the comparator caused by the modulation about a fixed bias voltage $V_x$ established by resistors 78 and 80, and finally the output signal $F_r'$ depicting movable rising, or critical, edge of the output waveform available at output 56'.

Figure 7:
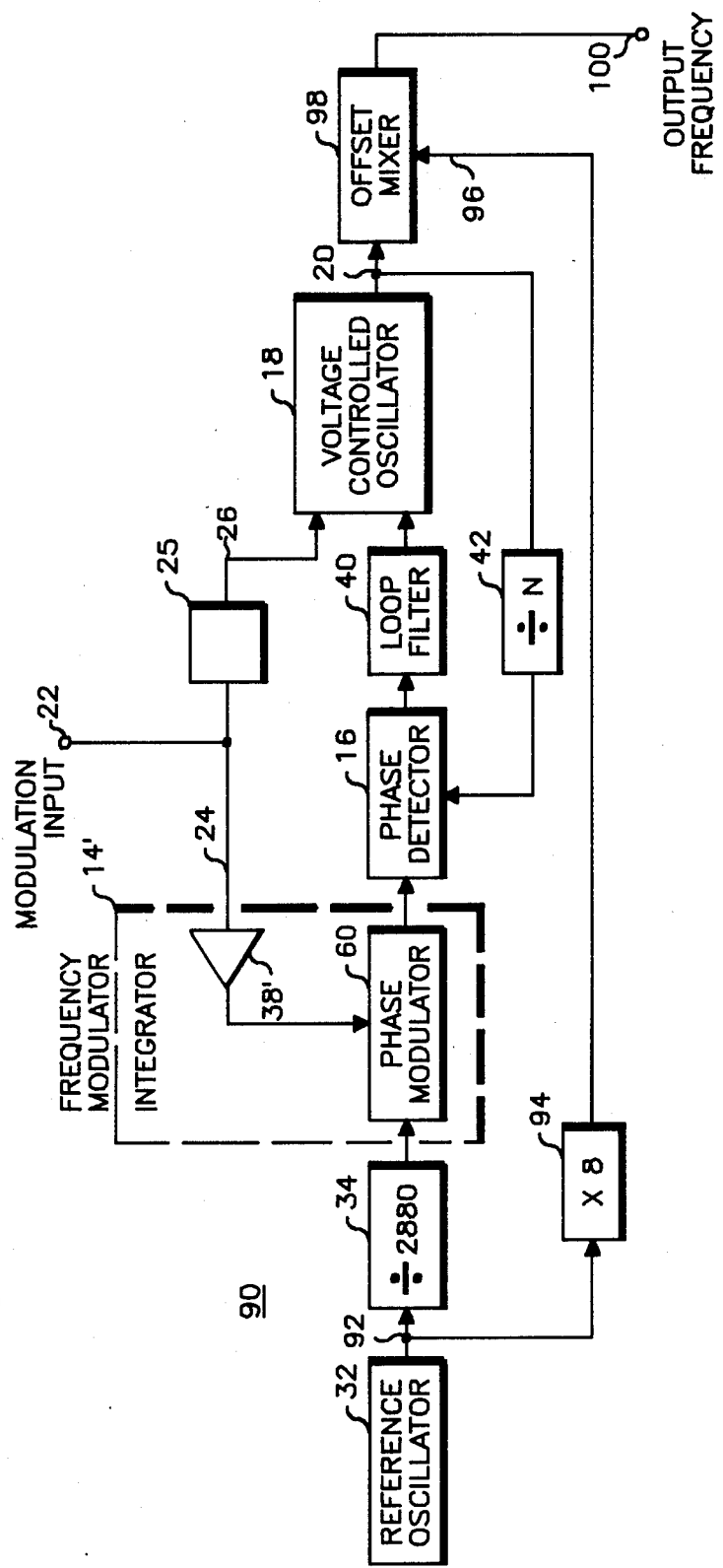
FIG. 7 is a preferred embodiment of a phase-locked loop frequency synthesizer employing the improved serrasoid phase modulator of the present invention and including an offset for generating relatively large percentage deviation FM signals at a relatively low frequency RF carrier.

FIG. 7 depicts at 90 another arrangement for a frequency modulated PLL synthesizer apparatus embodying the present invention. This arrangement is especially for lower frequency ranges requiring proportionally larger deviation with low distortion. As will be noted, it is similar to the PLL synthesizer depicted in FIG. 4, but takes the reference oscillator signal at 92, passes it through a multiplier 94 to the injection port 96 of an offset mixer 98 in order to offset or down-mix the modulated signal 20, which typically has less than 0.2 percent distortion at a modulating frequency of 30 Hz with 8 KHz deviation (4 KHz peak deviation) at 150–170 MHz, down to a lower frequency at output 100, while maintaining the same amount of deviation with low distortion at 30–50 MHz. Here, the fixed reference frequency divider 34 has a divisor of 2880, and multiplier 94 has a factor of 8. The circuit arrangement of FIG. 7 fulfills a long-felt need to achieve very wide deviation for very low modulating frequencies for a very low frequency range RF carrier. In this instance, where a Digital Private Line signal is needed to be transmitted in addition to voice signals, it is possible to determine the maximum peak deviation required for the DPL waveform which has a maximum length of time in either the zero or one state equal to about 44 milliseconds. Since the peak phase deviation is equal to the time integral of the peak frequency deviation integrated over a time interval, it is possible by known techniques to determine that for 750 Hertz of peak frequency deviation, one needs to be able to achieve 207 radians of peak phase deviation. This is a stark contrast to voice modulation which requires a orse case beta = 5000/300, or 16.7 radians, which is quite a bit less. To illustrate the value of the new phase modulator, it is instructive to consider previous techniques for implementing phase modulators. Perhaps the most common type of phase modulators are the varactor/LC type. Unfortunately, it is not practical to implement one at 5–10 KHz. However, even when considering a 3 section varactor/LC tuned phase modulator, it is only able to achieve about 130 degrees or 2.27 radians of phase deviation with reasonable linearity. The disclosed improved phase modulator 60 incorporated within the improved frequency modulator 14' is able to achieve the large phase (or frequency) peak deviation required for a reference center frequency in the region of 5 KHz to make the above PLL frequency synthesizer arrangements possible. Moreover, the improved low frequency, low noise, and high deviation performance of this improved phase modulator is a key element of the present invention.

Figure 8:
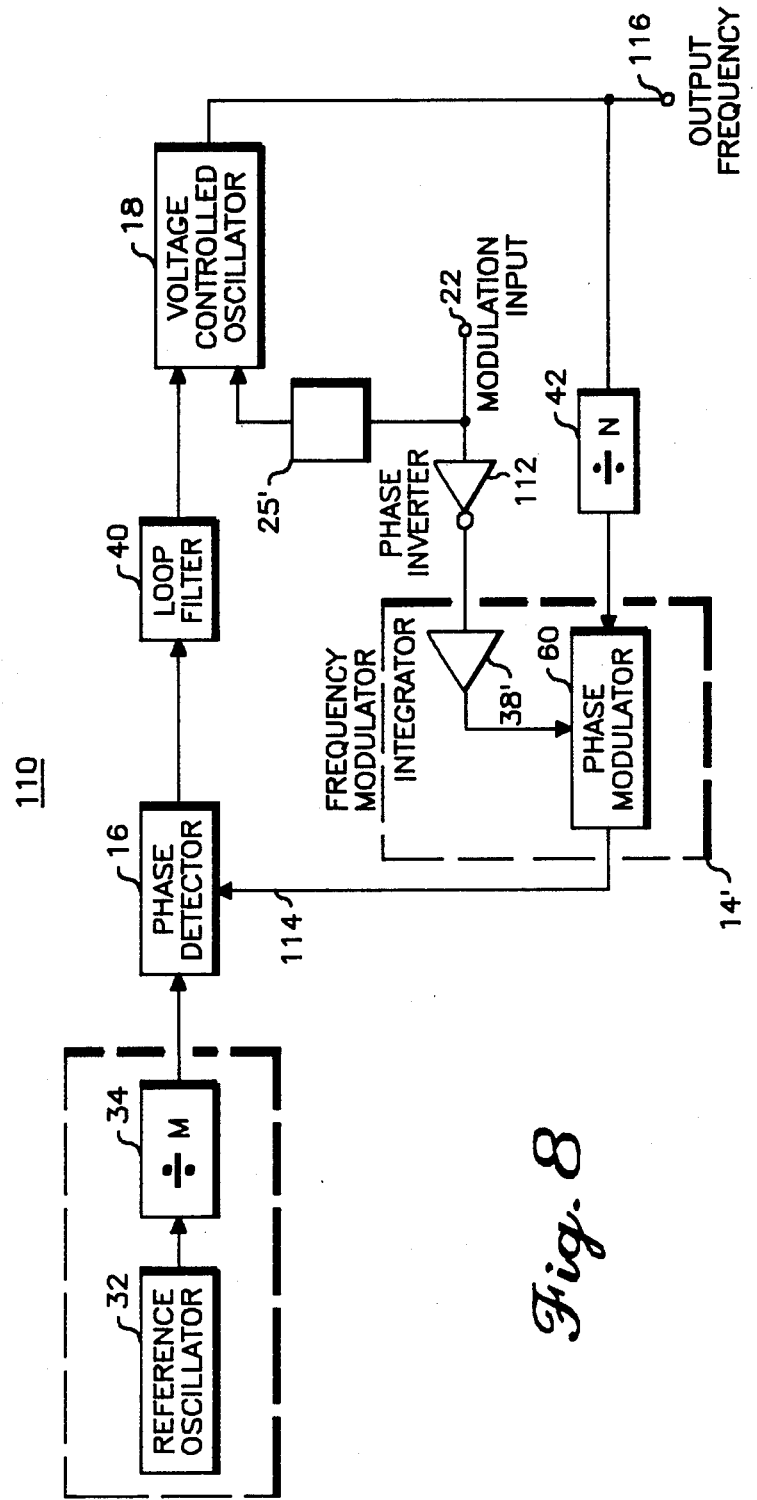
FIG. 8 is a configuration similar to FIG. 4 for a phase-locked loop frequency synthesizer except that it utilizes a modulation phase inverter in conjunction with the improved serrasoid phase modulator in the feedback path between the loop divider and the phase detector.

Finally, an alternate embodiment of a modulated PLL frequency synthesizer apparatus embodying the present invention is depicted at 110 FIG. 8. As will be noted, it is similar to the PLL synthesizer arrangement depicted in FIG. 4, but instead utilizes the improved frequency modulator consisting of low-noise serrasoid phase modulator 60 and integrator 14' with a phase inverter 112 to achieve cancellation of the modulation components in the feedback loop signal 114 before inputting this feedback signal to phase detector 16. The frequency modulated RF carrier output frequency occurs at output 116.

In summary, each of the above-mentioned arrangements 30', 90, and 110 is able to accomplish the frequency modulation of the PLL without losing gain balance between the two ports 24, 26 caused by variations in phase detector gain, and without the need for a delay network for maintaining proper phase synchronization of the modulated reference and modulated VCO signal components. Moreover, each of the above-mentioned arrangements 30', 90, and 110 is able to utilize the full modulation bandwidth down to less than 1 Hz and nearly approach the maximum available modulation bandwidth available by such an arrangement. Each of the above-mentioned arrangements exhibits an essentially flat, wide, modulation bandwidth that is independent of the PLL bandwidth. And, in particular, arrangement 90 is able to achieve full modulation bandwidth capabilities for very wide percentage deviation encompassing low frequency tones, digital data, as well as voice band signals for a transmitter operating with a relatively low frequency range RF carrier. Thus, each of the above arrangements, as well as the improved frequency modulator depicted in FIG. 6a, is able to overcome the limitations of the known prior art.

Although the several two-port synthesizer modulation arrangements of the present invention fully disclose many of the attendant advantages, it is understood that various changes and modifications not depicted herein are apparent to those skilled in the art. Therefore, even though the form of the above-described invention is merely a preferred or exemplary embodiment given with practical alternates, further variations may be made in the form, construction, and arrangement of the parts without departing from the scope of the above invention.

I claim:

1. An improved two-port frequency modulating apparatus for a phase-locked loop frequency synthesizer, comprising in combination:
    an unmodulated reference source including an oscillator and a fixed-integer frequency divider;
    a phase detector having a first input coupled to said reference source and an output coupled to a loop filter;
    a direct-FM VCO having an input port for coupling a modulating signal and the loop filter thereto and having an output with a feedback path coupled to a second input of said phase detector and including a selectable-integer frequency divider; and
    a modified frequency modulator, having an input port for the modulating signal and including an integrator and a low-noise phase modulator,
    said modified frequency modulator interposed between said unmodulated reference source and said phase detector and exhibiting a flat, wide, modulation bandwidth, down to less than 1 Hertz, which effectively cancels the modulation components induced by the direct-FM VCO, thereby providing a modulation bandwidth for the frequency synthesizer which is nearly equal to the theoretical maximum available bandwidth.

2. The arrangement according to claim 1, wherein said modified frequency modulator includes an integrator and a low-noise serrasoid phase modulator.

3. The frequency modulating arrangement according to claim 1, wherein said low-noise phase modulator comprises:
    a comparator having a first terminal for inputting a modulating signal;
    a capacitor having a first terminal connected to ground and a second terminal coupled to a second input of said comparator;
    an electronic switch having first and second terminals coupled to the first and second terminals of said capacitor, and a third terminal for inputting a reference signal; and
    passive current source means coupled to the second terminal of said capacitor and including a filter section and a current-limiting section.

4. The two-port frequency modulating arrangement according to claim 1, wherein the low-noise phase modulator includes a passive current source having a filter section comprising a series combination of a first resistor and a capacitor, with a first terminal of the capacitor connected to ground and a first terminal of the first resistor connected to a constant supply voltage, and a second terminal of each of the resistor and the capacitor coupled to a current-limiting section comprising at least one resistor significantly larger in value than said first resistor.

5. A method of two-port frequency modulating the output of a phase-locked loop frequency synthesizer providing an essentially flat modulating frequency response down to less than 1 Hertz with very low distortion and independent of the loop bandwidth, said method comprising the steps of:
    producing a high stability unmodulated reference signal at predetermined frequency;
    generating an output signal in a voltage controlled oscillator which has its output frequency proportional to an applied DC input voltage;
    feeding back a portion of the generated output signal, detecting a phase difference between said reference signal and said output feedback signal, and producing an output corrected signal for maintaining the voltage controlled oscillator at a desired frequency; and
    introducing modulation balanced between a first and second port of the phase-locked loop frequency synthesizer, said first port for frequency modulating the output of the voltage controlled oscillator, and said second port for frequency modulating the predetermined frequency of said high stability unmodulated reference signal down to less than 1 Hertz so as to effect equal magnitude and polarity frequency deviation with respect to said voltage controlled oscillator whereby the resultant modulation effected by each of said ports is cancelled during the step of detecting the phase difference between said reference signal and said output feedback signal.

6. The method according to claim 5, wherein the step of producing a high stability unmodulated reference signal comprises generating a high frequency signal having high stability and then dividing the frequency thereof by an integer to produce said predetermined frequency.

7. The method according to claim 5, wherein the step of feeding back a portion of the generated output signal comprises dividing the frequency of said output signal by a selected integer.

8. The method according to claim 5, wherein he step of detecting the phase difference includes a further step of filtering the output correction signal to maintain the voltage controlled oscillator at a desired frequency.

9. The method according to claim 5, wherein the step of introducing modulation into the second port comprises integrating and then phase modulating the predetermined frequency of said high stability unmodulated reference signal in a low-noise phase modulator before the step of detecting a phase difference.

10. An improved two-port frequency modulating arrangement for a phase-locked loop frequency synthesizer, comprising in combination:
unmodulated reference source means;
means for phase detecting having a first input coupled to said unmodulated reference source means and an output coupled to an included loop filtering means;
direct-FM VCO means having an input port for coupling a modulating signal and the loop filter thereto and having an output which couples to an included selectable-integer frequency dividing means in a feedback path to a second input of said phase detecting means; and
a modified frequency modulator having an input port for the modulating signal and interposed between said unmodulated reference source means and said phase detecting means, said modified frequency modulator exhibiting a flat, wide, modulation bandwidth, down to at least 1 Hertz, which effectively cancels modulation components induced by the direct-FM VCO, thereby providing a modulation bandwidth for the frequency synthesizer which is nearly equal to the theoretical maximum available bandwidth.

11. The apparatus according to claim 10, wherein said unmodulated reference source means includes an oscillator and a fixed-integer frequency divider.

12. The apparatus according to claim 10, wherein said phase detecting means includes a sample-and-hold phase detector.

13. The apparatus according to claim 10, wherein said phase detecting means includes a charge pump type of phase detector.

14. The apparatus according to claim 10, wherein said direct-FM VCO means comprises a direct-FM VCO having a first input coupled to said loop filter for generally controlling the center frequency of said VCO and a second input having lesser sensitivity for frequency modulating said VCO about its center frequency.

15. The apparatus according to claim 10, wherein said low-noise phase modulator includes a low-noise serrasoid phase modulator comprising a comparator and a voltage ramp generator having a capacitive storage element with a first terminal coupled to one input of said comparator and a second terminal connected to ground, and an electronic switch having first and second terminals connected to respective terminals of said capacitive storage element as well as having a third terminal for inputting a reference signal, and a passive current source which exhibits low noise coupled to the second terminal of said capacitive storage element.

16. The apparatus according to claim 15, wherein said passive current source comprises:
a filter section having a series combination of a first resistor and a capacitor with a first terminal of the capacitor connected to ground and a first terminal of the resistor connected to a constant supply voltage; and
a current-limiting section, coupled to a second terminal of each of the first resistor and the capacitor of said filter section, including a second resistor which is approximately one order of magnitude larger than said first resistor interposed between said filter section and said capacitive storage element.

17. A low-noise phase modulator apparatus, comprising in combination:
comparator means having a first input coupled to a modulating input signal;
a capacitive storage element with a first terminal coupled to a second input of said comparator and its second terminal connected to common ground;
an electronic switch with first and second terminals coupled to the respective terminals of said capacitive storage element and with a third terminal coupled to a reference frequency for providing control thereof; and
a passive current source, including a filter section and a current-limiting section, coupled between a supply voltage and said second terminal of the comparator,
said a passive current source providing reduced low frequency noise and cooperating with said electronic switch to provide a nearly linear ramp voltage on said capacitive storage element.

18. The low-noise phase modulator according to claim 17, wherein said passive current source comprises a filter section having a first resistor and a capacitor coupled in series between said supply voltage and common ground and a current-limiting section comprising a second resistor approximately one order of magnitude greater than said first resistor interposed between said filter section and said capacitive storage element so as to provide a nearly constant current to said capacitive storage element.

19. An improved two-port frequency modulating apparatus for a phase-locked loop frequency synthesizer which has a relatively low frequency RF carrier with relatively high percentage deviation frequency modulation at its output, comprising in combination:
unmodulated reference source means;
phase detecting means having a first input coupled to said reference source means and an output coupled to included loop filtering means;
direct-FM VCO means having an input port for coupling a modulating signal and the loop filtering means thereto and having an output which coupled to an included selectable-integer frequency dividing means in a feedback path to a second input of said phase detecting means;
offset mixing means having a first input coupled to said direct-FM VCO means and a second input coupled through multiplying means to said unmodulated reference source; and
a modified frequency modulator having an input port for the modulating signal and including an integrator and a low-noise phase modulator,
said modified frequency modulator interposed between said unmodulated reference source means and said phase detecting means and exhibiting a flat, wide, modulation bandwidth, down to at least 1 Hertz, which effectively cancels modulation components induced by said direct-FM VCO means, and said offset mixing means for down mixing the output of said direct-FM VCO means, thereby providing a relatively low frequency RF output carrier with relatively large percentage deviation and providing a modulation bandwidth for the frequency synthesizer which is nearly equal to the theoretical maximum available bandwidth.

20. The apparatus according to claim 19, wherein said unmodulated reference source means includes an oscillator and a fixed-integer frequency divider.

21. The apparatus according to claim 19, wherein said phase dectecting means includes a sample-and-hold phase detector.

22. The apparatus according to claim 19, wherein said phase detecting emans includes a charge pump type of phase detector.

23. The apparatus according to claim 19, wherein said direct-FM VCO means comprises a direct-FM VCO having a first input coupled to said loop filter for generally controlling the center frequency of said VCO and a second input of lesser sensitivity for frequency modulating said VCO about its center frequency.

24. The apparatus according to claim 19, wherein said low-noise phase modulator includes a low-noise serrasoid phase modulator comprising a comparator and a voltage ramp generator having a capacitive storage element with a first terminal coupled to one input of said comparator and a second terminal connected to ground, and an electronic switch having first and second terminals connected to respective terminals of said capacitive storage element as well as having a third terminal for inputting a reference signal, and a passive current source which exhibits low noise coupled to the second terminal of said capacitive storage element.

25. The apparatus according to claim 19, wherein said passive current source comprises:

a filter section having a series combination of a first resistor and a capacitor with a first terminal of the capacitor connected to ground and a first terminal of the resistor connected to a constant supply voltage; and a current-limiting section, coupled to a second terminal of each of the first resistor and the capacitor of said filter section, including a second resistor which is approximately one order of magnitude larger than said first resistor interposed between said filter section and said capacitive storage element.

* * * * *